THERMOELEMENTS AND THERMOELECTRIC DEVICES EMBODYING THE SAME

Filed Sept. 10, 1959

WITNESSES

Wm. B. Sellers.

Charles L. Menzemer

INVENTORS
William A. Tiller, James P. McHugh
and Robert H. Moss.
BY
Frederick Shapoe
ATTORNEY 3,005,861

THERMOELEMENTS AND THERMOELECTRIC DEVICES EMBODYING THE SAME

William A. Tiller and James P. McHugh, Wilkinsburg, and Robert H. Moss, Pittsburgh, Pa., assignors to Westinghouse Electric Corporation, East Pittsburgh, Pa., a corporation of Pennsylvania Filed Sept. 10, 1959, Ser. No. 839,167
7 Claims. (Cl. 136—5)

The present invention relates generally to thermoelements, and particularly to thermoelements comprised of germanium telluride, and thermoelectric devices embodying the same.

Germanium telluride is shown to be good thermoelectric material in the temperature range of 700° K. to 975° K. as set forth in copending patent application Serial No. 787,041, filed January 15, 1959, of A. J. Cornish, and assigned to the assignee of the present invention.

However, difficulty has been encountered in the preparation of germanium telluride bodies with sufficient mechanical strength to withstand without breaking or cracking, cutting, thermal cycling, soldering, assembling and other operations required in the manufacture and operation of thermoelectric devices. Elements of stoichiometric GeTe prepared by the Bridgeman technique are often found to crack during the normal cooling to room temperature after crystal growth.

If crystal grown germanium telluride compound substantially $Ge_{49.39}Te_{50.61}$, could be prepared with an extremely fine grain size, it is believed the material would have, in addition to good thermoelectric properties, good mechanical properties. However, it is difficult, if not impractical, to prepare pellets or other bodies of any usable size with sufficiently fine grains.

An object of the present invention is to provide a thermoelectric germanium telluride material with improved mechanical properties.

Another object of the present invention is to provide a mechanically strong p-type thermoelectric material consisting primarily of a body of a composition having the formula $Ge_{49.39}Te_{50.61}$ with added small amount of germanium intimately distributed therein.

Another object is to provide a thermoelectric material with improved mechanical strength comprising a body having the formula $Ge_{50.15}Te_{49.85}$ and being comprised of about 1.5 atomic percent germanium and about 98.5 atomic percent of a composition having the formula $Ge_{49.39}Te_{50.61}$.

A still further object of the invention is to provide a thermoelectric device comprising a thermoelectric pair, one of which comprises a material with improved mechanical strength comprising a body having the formula $Ge_{50.15}Te_{49.85}$ and being comprised of about 1.5 atomic percent germanium and about 98.5 atomic percent of a composition having the formula $Ge_{49.39}Te_{50.61}$.

Other objects of the present invention will, in part, be obvious and will, in part, appear hereinafter.

For a better understanding of the nature and objects of the invention, reference should be had to the following detailed description and drawings, in which.

In accordance with the present invention, in attainment of the foregoing objects, there is provided a thermoelectric material having improved mechanical properties, said material comprising a crystalline body having the formula $Ge_{50.15}Te_{49.85}$, which material consists primarily of the compound $Ge_{49.39}Te_{50.61}$ and the remainder, approximately 1.5 atomic percent, being Ge intimately distributed therein, and said material having particularly good thermoelectric properties in the temperature range of from about 400° C. to 700° C.

Figure 1:
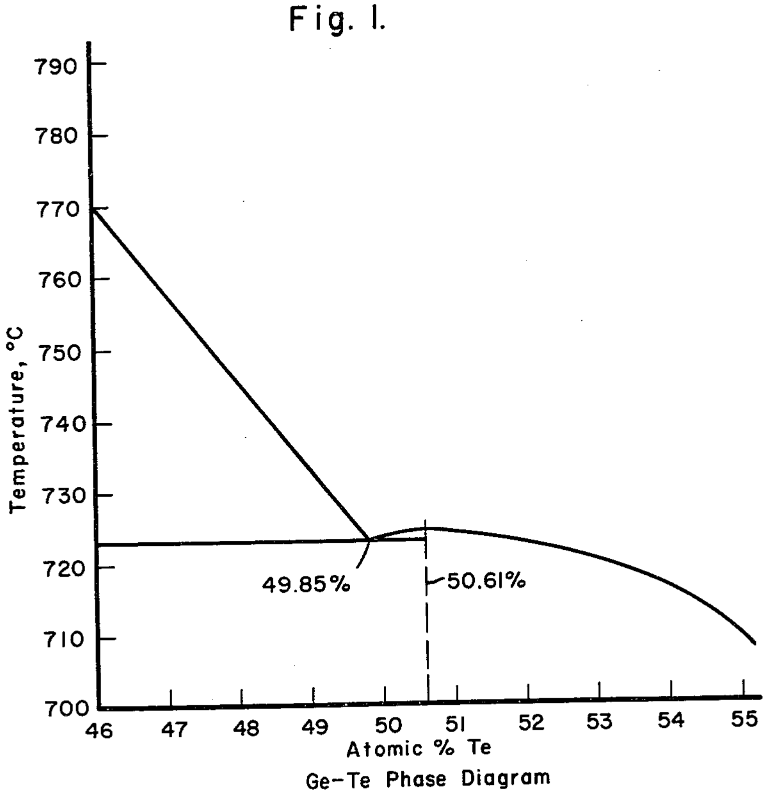
FIGURE 1 is the phase diagram of the germanium tellurium system.

With reference to FIG. 1, there is illustrated a perfected phase diagram for the germanium tellurium system at atmospheric pressure. The present invention is based in part thereon. This phase diagram has been prepared by the present inventors and is a detailed diagram of the system as developed by extensive research. It corrects errors in the Klemm and Frischmuth diagram (Z. Anorg. Chem. 218, 249–51 (1934)). It can be seen from FIG. 1 that a eutectic phase boundary exists at the composition 50.15 atomic percent germanium and 49.85 atomic percent tellurium. A thermoelectric germanium telluride material having the composition $Ge_{50.15}Te_{49.85}$ will have good mechanical properties since we have discovered that the eutectic composition consists of two phases (about 1.5 atomic percent of Ge and the balance the compound $Ge_{49.39}Te_{50.61}$) and the dimensions of the phase particles is very small, for example, about 1 micron to 10 microns. It is to be understood that the above-mentioned eutectic material provides the optimum mechanical properties; however, slight departures on either side of this eutectic composition, particularly on the Ge rich side, for instance from 1 to 2 atomic percent of Ge, will still give good mechanical properties provided that the interparticle distances are still small.

One preferred method of preparing crystalline germanium telluride having the formula $Ge_{50.15}Te_{49.85}$ and comprised of 1.5 atomic percent Ge and 98.5 atomic percent $Ge_{49.39}Te_{50.61}$, comprises admixing predetermined proportions of finely divided germanium and tellurium to form the eutectic alloy (50.15 atomic percent Ge and 49.85 atomic percent Te), and charging the mixture into a vessel of quartz or other inert material which will not react with the germanium-tellurium melt. The vessel is then evacuated and sealed off under a vacuum of approximately $10^{-4}$ mm. of Hg. The vessel is placed in a vertical tube furnace and heated to a temperature in excess of 722° C., preferably a temperature of approximately 800° C., at which temperature the entire mixture becomes molten. The vessel is agitated to insure complete mixing during the melting period. The vessel is then slowly lowered through the furnace the rate of approximately ¼ to 2 inches per hour to insure progressive crystallization. It should be noted that much faster lowering rates could probably be used without significant impairment of properties. After the vessel leaves the furnace, it is allowed to cool further to room temperature.

This is only one of several preparative techniques that might be used. For example, the eutectic alloy might be cast in large ingot form or be prepared by pressing and sintering.

The following examples illustrate the practice of this invention and show the physical superiority of the material of this invention over some other germanium telluride alloys.

*Example I*

To prepare a 75 gram sample of the eutectic composition (50.15 atomic percent germanium and 49.85 atomic percent tellurium) 27.3005 grams of germanium and 47.6995 grams of tellurium were charged into a quartz bulb having an inside diameter of approximately 1 centimeter. The bulb was evacuated and sealed off under a vacuum of $10^{-4}$ mm. of mercury. The bulb was then placed in the center of a vertical 12 inch furnace and heated to 800° C. at which temperature the mixture became molten. The bulb was agitated to insure mixing during the heating step. The bulb was left suspended at approximately the mid-point of the furnace which was maintained at a temperature of 800° C., to ensure melting and mixing. The bulb was then allowed to descend through the furnace at a rate of approximately ¼ inch per hour. After completely descending from the furnace the bulb and its contents were cooled to room temperature.

The material thus produced was p-type material having the formula $Ge_{50.15}Te_{49.85}$ and was comprised essentially of 1.5 atomic percent Ge and 98.5 atomic percent $Ge_{49.39}Te_{50.61}$.

*Example II*

The procedure of Example I was repeated using 72.60 grams of germanium and 127.6 grams of tellurium to produce germanium telluride having the formula GeTe. The material thus produced had p-type semiconductivity.

The materials of Example I and of Example II were found to have comparable thermoelectrical properties within a 440° C. to 600° C. temperature range. The electrical properties of the two materials are set forth in tabular form below.

| Composition | T, ° C. | P (ohm-cm.) | (MV/° C.) (Seebeck Coeff.) |
|---|---|---|---|
| $Ge_{50.00}Te_{50.00}$ | 440–600 | $5.9\times10^{-4}$ | 140 |
| $Ge_{50.15}Te_{49.85}$ | 440–600 | $4.6\times10^{-4}$ | 137 |

The procedures of Examples I and II were repeated. The respective germanium telluride compositions thus prepared were allowed to remain in the quartz bulbs and thermocycled repeatedly between approximately 650° C. and 25° C. The material prepared in accordance with Example I and having the eutectic composition $Ge_{50.15}Te_{49.85}$ indicated no effect from the thermocycling. The stoichiometric GeTe prepared in accordance with Example II soon exhibited cracking under the thermocycling test.

Figure 2:
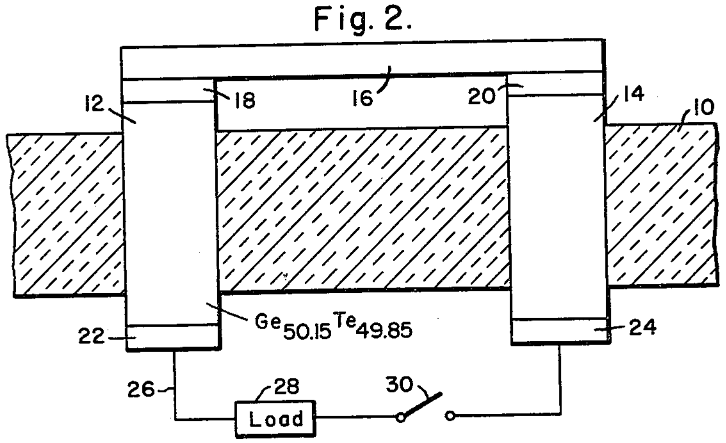
FIG. 2 is a side view, partially in cross-section of a thermoelectric generator.

With reference to FIG. 2 of the drawing, there is illustrated a thermoelectric device suitable for producing electrical current from heat. A thermally insulating wall 10 so formed as to provide suitable furnace chamber, is perforated to permit the passage therethrough of a positive thermoelectric member 12 of which at least a part comprises a pellet having the formula $Ge_{50.15}Te_{49.85}$, and a negative thermoelement member 14 such as indium arsenide. An electrically conducting strip 16 of metal, for example, copper, silver or the like is joined to an end face 18 of the member 12 and end face 20 of the member 14 within the chamber so as to provide good electrical and thermal contact therewith. The end faces 18 and 20 may be coated with a thin layer of metal, for example, by a vacuum evaporation or by use of ultrasonic brazing whereby good electrical contact is obtained. The metal strip 16 of copper, silver or the like may be brazed or soldered to the metal coated faces 18 or 20. The metal strip 16 may be provided with suitable fins or other means for conducting heat thereto from the furnace chamber in which it is disposed.

At the end of member 12 located on the other side of wall 10 is attached a metal plate or strip 22 by brazing or soldering in the same manner as was employed in attaching strip 16 to the end face 18. Similarly, a metal strip or plate 24 may be connected to the other end of member 14. The plates 22 and 24 may be provided with heat dissipating fins or other cooling means whereby heat conducted thereto may be dissipated. The surface of the plates 22 and 24 may also be cooled by passing a current of fluid such as water across their surfaces. An electrical conductor 26 containing a load 28 is electrically connected to the end plates 22 and 24. A switch 30 is interposed in the conductor 26 to enable the electrical circuit to be opened and closed as described. When the switch 30 is moved to the closed position, an electric current flows between members 12 and 14 and energizes the load 28. It will be appreciated that a plurality of pairs of the positive and negative members may be joined in series in order to produce a plurality of cooperating thermoelements. In a similar manner, each of the thermoelements will be disposed with one junction in a furnace or disposed to another source of heat while the other junction is cooled by applying water or flowing air thereon or the like. Due to the relative difference in the temperature of the junctions, an electrical voltage will be generated in the thermal elements. By joining in series, a plurality of the thermoelements, direct current of any suitable voltage can be generated.

While the element 12 has been shown to be comprised entirely of the material of this invention, it will be understood that the material may comprise only a portion of the element, the remainder being comprised of one or more materials of the same thermoelectric sign.

It will be appreciated that the various formulas set forth for the germanium telluride eutectic and the compound $Ge_{49.39}Te_{50.61}$ may be subject to slight departures which may occur by reason of different methods and conditions of preparation.

It will be appreciated that the above description and drawing is only exemplary and not exhaustive of the invention.

We claim as our invention:

1. A thermoelectric material having exceptionally good physical properties comprised essentially of a body of a fine two phase crystal structure composed of germanium telluride and having substantially the formula $$Ge_{50.15}Te_{49.85}$$

the first phase being comprised of from 1 to 2 atomic percent of germanium and the second phase comprising from 99 to 98 atomic percent of germanium telluride having the approximate formula $Ge_{49.39}Te_{50.61}$.

2. A thermoelectric material having exceptionally good physical properties having the formula $Ge_{50.15}Te_{49.85}$ and comprised of substantially 1.5 atomic percent germanium and substantially 98.5 atomic percent of $Ge_{49.39}Te_{50.61}$.

3. A thermoelectric device comprising a first p-type member comprised of two phase crystalline germanium telluride having substantially the formula $Ge_{50.15}Te_{49.85}$, the first phase being comprised of from 1 to 2 atomic percent of germanium and the second phase comprising from 99 to 98 atomic percent of germanium telluride having the approximate formula $Ge_{49.39}Te_{50.61}$, and a second member of opposite thermoelectric sign electrically connected to one portion of said first member whereby a junction is formed across the cross-sectional area at opposite ends of the members, the device, when subjected to a temperature difference between the junctions being capable of generating an electrical voltage.

4. A thermoelectric device comprising a first p-type member comprised of two phase crystalline germanium telluride having the formula $Ge_{50.15}Te_{49.85}$, and comprised of a first phase of substantially 1.5 atomic percent germanium and a second phase of substantially 98.5 atomic percent $Ge_{49.39}Te_{50.61}$, and a second member of opposite thermoelectric sign electrically connected to one portion of said first member whereby a junction is formed across the cross-sectional area at opposite ends of the members, the device, when subjected to a temperature difference between the junctions being capable of generating an electrical voltage.

5. A thermoelectric device for generating power comprising a first positive thermoelectric element of two phase crystalline eutectic germanium telluride having the formula $Ge_{50.15}Te_{49.85}$, the first phase being comprised of from 1 to 2 atomic percent of germanium and the second phase comprising from 99 to 98 atomic percent of germanium telluride having the approximate formula $Ge_{49.39}Te_{50.61}$, and a negative thermoelectric element connected to one portion of said first element, whereby a junction is formed across the cross-sectional area at opposite ends of the elements.

6. A thermoelectric device capable of generating power comprising a first positive thermoelectric element composed of two phase crystalline germanium telluride having substantially the formula $Ge_{50.15}Te_{49.85}$ and comprised of a first phase of substantially 1.5 atomic percent germanium and a second phase of substantially 98.5 atomic percent $Ge_{49.39}Te_{50.61}$ and a negative thermoelectric element connected to one portion of said first element, whereby a junction is formed across the cross-sectional area at opposite ends of the elements.

7. A thermoelectric device capable of generating power comprising a first p-type member comprised of two phase crystalline germanium telluride having the formula $Ge_{50.15}Te_{49.85}$, the first phase being comprised of from 1 to 2 atomic percent of germanium and the second phase comprising from 99 to 98 atomic percent of germanium telluride having the approximate formula $Ge_{49.39}Te_{50.61}$ a second member of a negative thermoelement material, an electrically conductive member disposed between and metallurgically joined to a first surface of said first member and a first surface of said second member, a heat source transmitting heat to the first surface of said first and said second member, an electrical conductor joining a second surface of said first member and a second surface of said second member, and means for cooling said second surface of said first and said second member, whereby an electrical current is generated in the device.

References Cited in the file of this patent

UNITED STATES PATENTS 2,886,618 Goldsmid -------------- May 12, 1959

OTHER REFERENCES

Chem. Abs., vol. 51, page 12, 639, para. h, 1957.

Moriguchi et al.: Jour. Phys. Soc. Japan, vol. 12, 1957, page 100.